United States Patent [19]

Vernon

[11] Patent Number: 5,260,168
[45] Date of Patent: Nov. 9, 1993

[54] APPLICATION SPECIFIC TAPE AUTOMATED BONDING

[75] Inventor: Robert D. Vernon, Norfolk, Mass.

[73] Assignee: The Foxboro Company, Foxboro, Mass.

[21] Appl. No.: 902,418

[22] Filed: Jun. 19, 1992

Related U.S. Application Data

[63] Continuation of Ser. No. 421,247, Oct. 13, 1989, abandoned.

[51] Int. Cl.$^5$ .................................................. G03C 5/00
[52] U.S. Cl. ...................................... 430/313; 430/311;
430/314; 430/318; 428/137; 428/40; 29/827;
29/846; 257/664; 257/668
[58] Field of Search ................ 430/313, 311, 314, 318;
428/137, 40; 29/827, 846, 847; 257/664, 668

[56] References Cited

U.S. PATENT DOCUMENTS

| | | | |
|---|---|---|---|
| 3,511,657 | 5/1970 | Smith | 96/50 |
| 3,567,445 | 3/1971 | Atkinson et al. | 96/33 |
| 3,578,451 | 5/1971 | Doggett | 96/33 |
| 3,607,346 | 9/1971 | Darlow et al. | 117/34 |
| 3,867,150 | 2/1975 | Ketley | 96/36.3 |
| 4,168,980 | 9/1979 | La Rossa | 96/114 |
| 4,299,912 | 11/1981 | Shiba et al. | 430/302 |
| 4,327,167 | 4/1982 | Tanabe | 430/31 |
| 4,347,305 | 8/1982 | Shiba et al. | 430/302 |
| 4,358,530 | 11/1982 | Shiba | 430/273 |
| 4,373,018 | 2/1983 | Reichmanis et al. | 430/312 |
| 4,409,316 | 10/1983 | Zeller-Pendrey | 430/263 |
| 4,469,777 | 9/1984 | O'Neil | 430/315 |
| 4,477,562 | 10/1984 | Zeller-Pendrey | 430/513 |
| 4,512,843 | 4/1985 | Miyazaki | 430/313 |
| 4,515,877 | 5/1985 | Barzynski et al. | 430/5 |
| 4,555,471 | 11/1985 | Barzynski et al. | 430/273 |
| 4,666,818 | 5/1987 | Lake et al. | 430/313 |
| 4,690,374 | 6/1987 | Bellus et al. | 430/505 |
| 4,701,363 | 10/1987 | Barber | 358/70 |
| 4,812,421 | 3/1989 | Jung et al. | 29/827 |
| 4,849,857 | 7/1989 | Butt et al. | 361/388 |
| 4,944,850 | 7/1990 | Dion | 204/15 |
| 4,948,645 | 8/1990 | Holzinger et al. | 428/137 |
| 4,953,005 | 8/1990 | Carlson et al. | 357/80 |
| 4,957,882 | 9/1990 | Shinomiya | 437/209 |

FOREIGN PATENT DOCUMENTS

| | | |
|---|---|---|
| 350947A1 | 9/1986 | Fed. Rep. of Germany . |
| 2158869 | 5/1973 | France . |
| 55-50246 | 10/1978 | Japan . |
| 462286 | 3/1937 | United Kingdom . |
| 1068557 | 5/1967 | United Kingdom . |
| 1411423 | 10/1975 | United Kingdom . |
| 2128351 | 4/1984 | United Kingdom . |
| 2130397 | 5/1984 | United Kingdom . |
| 2135793A | 9/1984 | United Kingdom . |
| 2178231A | 2/1987 | United Kingdom . |

OTHER PUBLICATIONS

Lake et al., application Ser. No. 07/489,789, "Method of Patterning Resist".

J. W. Boone et al., "Photomaterial For The Fabrication of Printed Circuits", IBM Technical Disclosure Bulletin, vol. 12, No. 12, 1970, p. 2159.

D. G. Vam Oppens, "Dry-Peel Photo Emulsion Stripping", IBM Technical Disclosure Bulletin, vol. 12, No. 11, 1970, pp. 1777-1778.

B. C. Atwood, "High Resolution Photomask", IBM Technical Disclosure Bulletin, vol. 13, No. 7, 1970, p. 2078.

*Primary Examiner*—Richard L. Schilling
*Assistant Examiner*—Thomas R. Neville
*Attorney, Agent, or Firm*—Fish & Richardson

[57] ABSTRACT

A method for patterning a tape to which an integrated circuit may be bonded including providing a tape having a top layer of unexposed film which, when exposed in an interconnection pattern and developed, acts as a mask for processing a photoprocessable layer of the tape to provide conductive portions in an interconnection pattern on the tape.

10 Claims, 7 Drawing Sheets

PLOT

DEVELOP

EXPOSE RESIST

PEEL FILM

REMOVE SOFT RESIST

ETCH COND. MATERIAL

REMOVE HARD RESIST

APPLICATION SPECIFIC TAPE AUTOMATED BONDING

This is a continuation of application Ser. No. 07/421,247, filed Oct. 13, 1989, now abandoned.

CROSS-REFERENCE TO RELATED PATENTS

This application is related to Lake et al. U.S. U.S. Pat. No. 4,666,818 and its continuation-in-part U.S. patent application Ser. No. 006,624, now abandoned, filed Jan. 22, 1987, both entitled "Method of Patterning Resist", assigned to the assignee of the present application and hereby incorporated by reference.

BACKGROUND OF THE INVENTION

The invention relates to tape automated bonding.

Tape automated bonding (TAB) is an interconnection system which is used to connect semiconductor chips (die) to a next level of interconnection (e.g., a printed circuit (PC) board or an integrated circuit package). TAB uses a TAB tape having a substrate which defines sprocket holes and windows, and a plurality of conductors, which are arranged in frames of interconnect patterns superimposed over the substrate. Each frame's conductors extend over a respective window. An integrated circuit (IC) die is inserted into the window from below the die and the inputs and outputs (I/O's) of the TAB tape are bonded to the ends of the conductors which extend over the window. The conductors with ICs attached are then severed from the TAB tape and simultaneously attached to a PC board, e.g., via surface mounting technology.

Conventional TAB tape is fabricated by registering a mask containing a desired conducting portion pattern over a tape having a layer of photoresist superimposed over a layer of conducting material, exposing a section of the photoresist layer of tape through the mask to high energy electromagnetic radiation, advancing the tape a set amount, stopping the tape, and exposing another section of the tape. As subsequent sections of tape are exposed, the photoresist layer of previous sections are developed to define patterns of conductive portions which are used to etch the layer of conducting material to provide frames of conductors arranged in interconnect patterns on the surface of the tape.

An alternative to TAB is wire bonding in which individual wires are bonded between the IC die's inputs and outputs and the PC board. TAB provides a plurality of widely acknowledged advantages which include: higher functional board density and reduction in printed circuit (PC) board real estate; lower assembly costs in volume runs; decreased material costs as TAB requires substantially less conductive material; more mechanical reliability; better performance because the short length of TAB leads decreases the wiring length between the IC die and the next level of interconnection; and, better heat dissipation because the back of the IC die can be directly attached to heat sinks. Additionally, because the IC die is bonded to conductive portions which are supported by the tape, TAB technology improves quality control by allowing each IC die to be electrically tested and burned-in prior to any board level assembly. See Banks, "Facts about TAB", *Printed Circuit Assembly*, Vol. 3, No. 3 (March 1989), pp. 28-30, and Castrovilla, "Surface Mount and TAB: Their Impact on PWBs", *Printed Circuit Assembly*, Vol. 3, No. 3 (March 1989), pp. 35-37.

Despite TAB's widely acknowledged advantages, the present technology of TAB presents a number of limitations. Presently, the TAB process is only used to produce a tape having a succession of identical chip interconnection patterns because TAB is presently fabricated using a mask which must be aligned with the unexposed TAB tape. The semiconductor industry, however, is currently shifting from standardized chip designs to application specific integrated circuits (ASIC). ASICs are integrated circuits which are designed for a particular application, thus, ASICs provide a user with the advantage of reducing the chip count in a particular design. The number of ASIC designs is increasing, and, along with this increase, the number of different chip interconnection patterns is also increasing. Accordingly, the TAB technology must also shift "from high volume, long-run, reel-to-reel commodity chip patterns to low-volume, short-run, singulated ASIC patterns." Augelucci, Sr., "The state of TAB interconnects", *Electronic Engineering Times*, Issue 555 (Sep. 11, 1989), p. T12.

Added to this limitation is the increasing use of Just-In-Time Inventory Control in which a subassembly is completed just as it is needed for the next level of integration. The present TAB technology is antithetical to the just-in-time philosophy because TAB in its present form is only efficient for use in generating long runs of the same chip interconnection pattern.

An additional limitation arises in using TAB technology in developing new or unique systems such as prototypes. The non-recurring engineering costs such as design engineering and photo-tooling of the present TAB technology can be both prohibitively expensive and time consuming when used in a low volume application such as a prototype system.

SUMMARY OF THE INVENTION

In the preferred embodiment, the invention comprises a flexible automated method for patterning a tape to which an integrated circuit may be bonded using tape automated bonding. The invention accomplishes this purpose without the need for expensive phototooling, special resists, high energy radiation sources or long runs of identical interconnection patterns. The method includes selectively exposing a portion of a photographic film layer of the tape to computer-directed energy forming an integrated circuit interconnection pattern and developing the film to provide an image of the interconnection pattern. A photoprocessable layer is then exposed through the film layer to substantially uniformly distributed directed energy and processed in conjunction with a conductive layer in order to provide conductors which correspond to the interconnection pattern being fabricated. By this method, the tape may be continuously patterned.

In an element of the preferred embodiment, a portion of the film may be exposed to directed energy for forming an identifying pattern such as a machine readable code; the developing, exposing and processing then provide an identifying portion on the tape. According to the above method, the tape may be exposed to a plurality of different interconnection patterns and a plurality of different identifying patterns and there may be an identifying portion which corresponds to each different interconnection pattern.

In another preferred embodiment, the invention comprises a method of high speed patterning of a tape to provide a plurality of duplicate interconnection patterns to which integrated circuit die may be bonded using tape automated bonding. The method includes continuously advancing the tape, intermittently illuminating an interconnection portion of a film layer of the tape with the integrated circuit interconnection pattern, processing the film and a photoresist layer of the portion to provide conductors in the interconnection pattern, and repeating the illuminating and processing to provide the plurality of duplicate interconnection patterns.

In one preferred embodiment, the invention includes providing identifying portions between the interconnection portions and advancing the tape to an integrated circuit bonding mechanism, and bonding integrated circuit die to respective interconnection patterns of the tape by, e.g., using the identifying portions to determine the type of integrated circuit die to be bonded to a specific interconnection pattern. Also, the identifying portions may be used to determine the type of integrated circuit present on a particular frame of the tape, and to place the integrated circuit on a desired site on a next level of interconnection such as a PC board.

In another aspect, the invention comprises a method for placing integrated circuit windows on a tape to be used in tape automated bonding. The method includes providing a layer of undeveloped film sensitive to a directed energy over a substrate, selectively exposing the film on a portion of the tape to the directed energy in a pattern corresponding to the integrated circuit windows, developing the film on the substrate, exposing the substrate to a different directed energy, and processing the substrate to provide the tape with integrated circuit windows.

In another aspect, the invention comprises a novel material for generating TAB tape. The material includes a dielectric substrate which defines sprocket holes, a layer of conductive material superimposed over the substrate, a layer of photoresist material superimposed over the layer of conductive material, and a layer of photographic film superimposed over the layer of photoresist. In this preferred embodiment of this aspect of the invention, the substrate may define a window, and the conductive layer may be superimposed over the window.

In another aspect, the invention is an apparatus for generating a substrate for a tape for tape automated bonding. The apparatus includes a dielectric substrate which defines sprocket holes, a layer of photoresist superimposed over the substrate, and a layer of film superimposed over the layer of photoresist.

In yet another aspect, the invention is a finished tape for tape automated bonding. The tape includes a substrate defining sprocket holes and windows, and conductors superimposed on the substrate, the conductors being arranged in a plurality of different interconnection patterns. It is preferred for this embodiment that identifying portions are also interposed between the interconnection patterns on the substrate.

DETAILED DESCRIPTION

Structure

Figure 1:
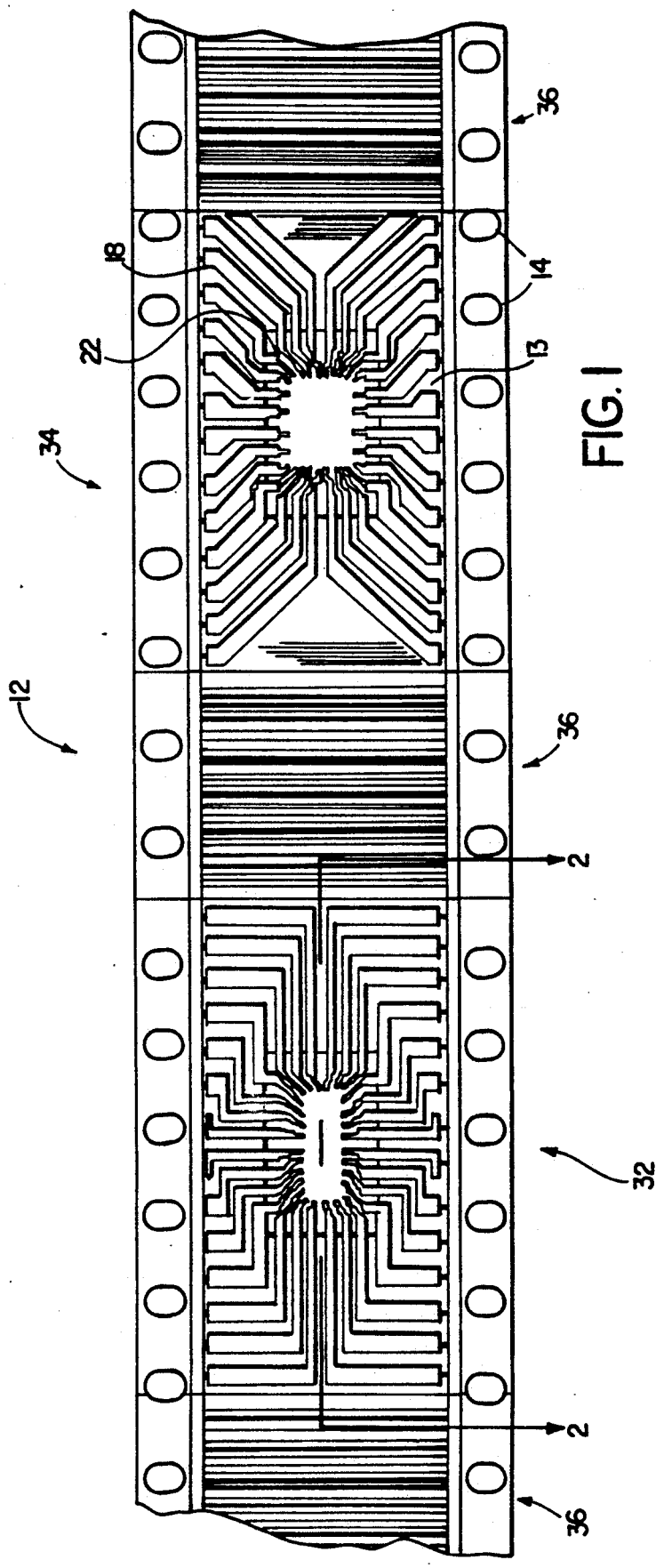
FIG. 1 is a diagrammatic plan view of a portion of a TAB tape according to the present invention.
Figure 2:
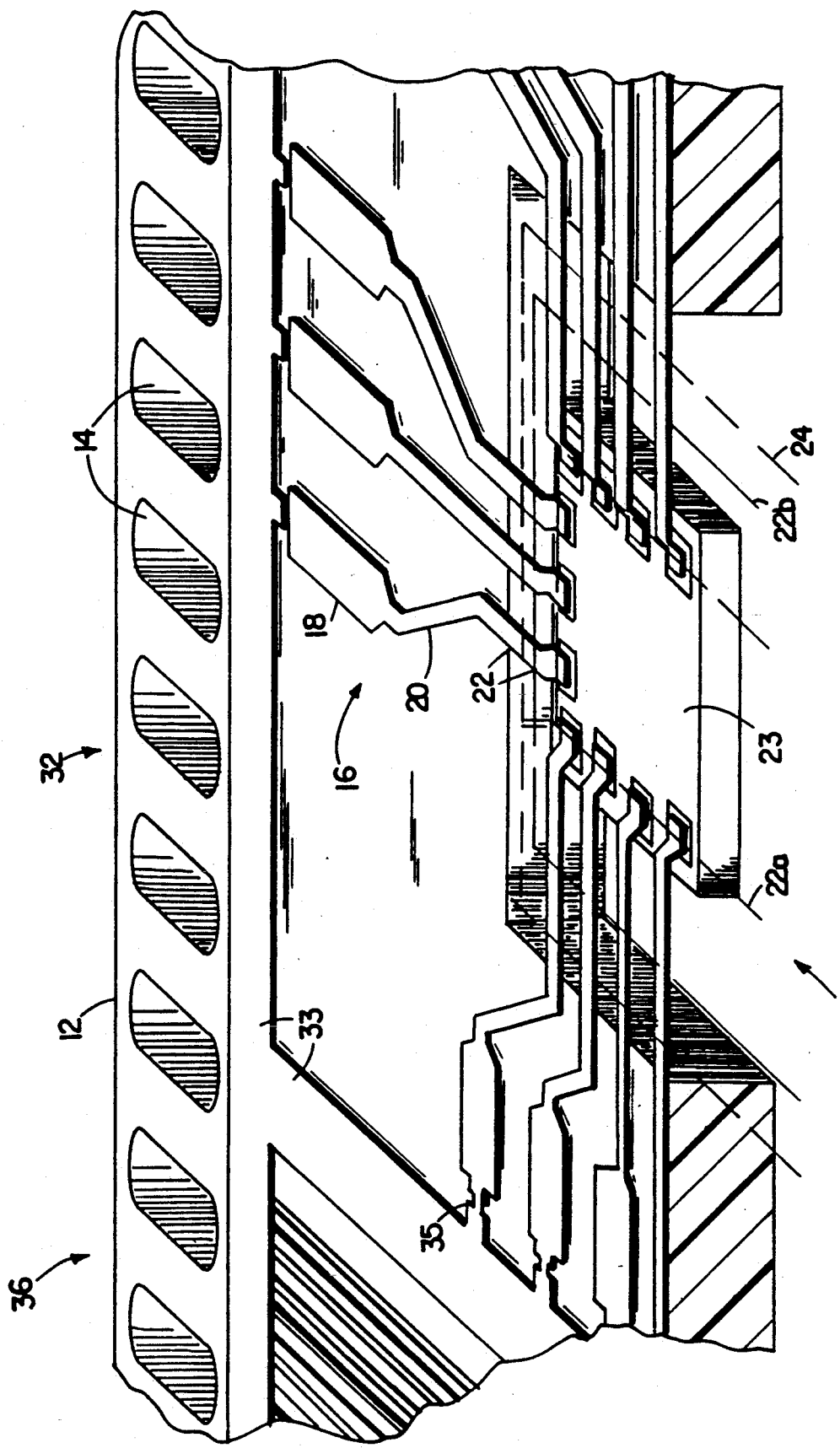
FIG. 2 is a perspective view in longitudinal cross-section, sectioned along a line corresponding to line 2—2 of FIG. 1, of a portion of a TAB tape to which an integrated circuit die is bonded according to the present invention.

FIG. 1 shows a portion of a single TAB tape according to the invention in completed form ready for attachment of ASICs with different dimensions and lead patterns in successive chip lead frames separated by bar code frames. FIG. 2 shows the tape after the ICs are bonded to the tape, i.e., in a condition where it is ready to be fed to an automated sequential substrate populating mechanism which severs the connectors and bonds the leads and chips to their destined locations on a PC board, for example.

Referring to FIGS. 1 and 2, TAB tape 12 includes windows 13, and sprocket holes 14 which are used to transport tape 12, an conductors 16 which are carried on the surface of tape 12. Each conductor 16 includes a test pad 18, a connector portion 20 and a bonding portion 22. Bonding portions 22 are arranged to provide an inner lead bond (ILB) pattern 22a, which matches the I/O terminal layout on die 23 and an outer lead bond (OLB) pattern 22b which matches the next level of interconnection (e.g., a discrete package or an interconnection substrate such as a printed circuit (PC) board). The leads of the ILB tape pattern are bonded to the die I/O's either simultaneously using a compression bonding thermode or sequentially using a laser or other source of directed energy. The bonding portion 22 is then detached at dashed lines 24 by a punch device to provide conductors which correspond to OLB pattern 22b. The conductors corresponding to OLB pattern 22b are then connected to the next level of interconnection either by using a punch which includes a bonding mechanism or by having the punch hold the conductors against the next level of interconnection while a bonding mechanism bonds the conductors to the next level of connectors.

Conductors 16 of TAB tape 12 are arranged in frames of chip interconnection patterns 32, 34. Each frame may be a different pattern. As shown in FIG. 2, thief strip 33 surrounding each frame forms a common electrode for plating appropriate metal on the patterned copper to match die metallurgy. To isolate the interconnection pattern for testing, a cut 35 is made to disconnect the pattern to isolate it electrically from the thief strip 33.

As shown in FIG. 1, tape 12 also includes identifying portions 36 (e.g., a machine readable code such as a bar code), which provide information about the frames (e.g., the identity of the specific interconnection pattern and the number of each specific configuration) which either precede or follow identifying portion 36.

Figure 2A:
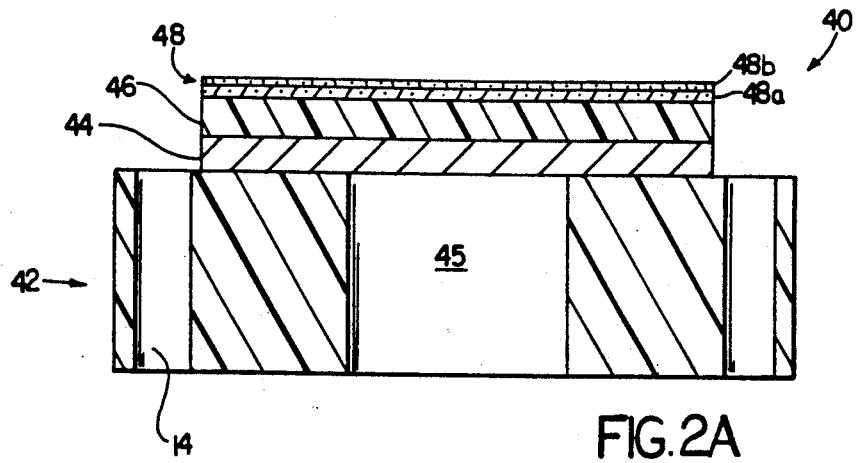
FIG. 2A is a diagrammatic, cross-sectional view of material used to generate the TAB tape of FIG. 1, according to the principles of this invention.

Referring to FIG. 2A, a cross-section of an unexposed TAB tape is shown. The tape is in the form of a starting material for making the finished TAB tape 12 of FIG. 1. Unexposed tape 40 includes substrate 42, e.g., a prepunched perforated dielectric film base available from E.I. duPont deNemours Co. under the trade designation Kapton, which carries a uniform layer of conductive material 44 such as copper. The prepunching provides window 45 and the perforating provides sprocket holes 14. A photoresist layer 46 is superimposed on conductive layer 44. A thin sheet of strip base photographic film 48, e.g., a high resolution, high contrast, orthochromatic film available from Agfa-Gevaert under trade designation 08115 or available from 3M under the trade designation TS5, is superimposed over layer 46. Film 48 includes a base layer 48a and an emulsion layer 48b. Substrate 42 is preferably 7 mils (0.007 inch) thick, conductive layer 44 is preferably 0.7 mil thick, photoresist layer 46 is preferably 1 mil thick, and film 48 is preferably one-quarter to one-half mil thick.

Method of Manufacture

Figure 3:
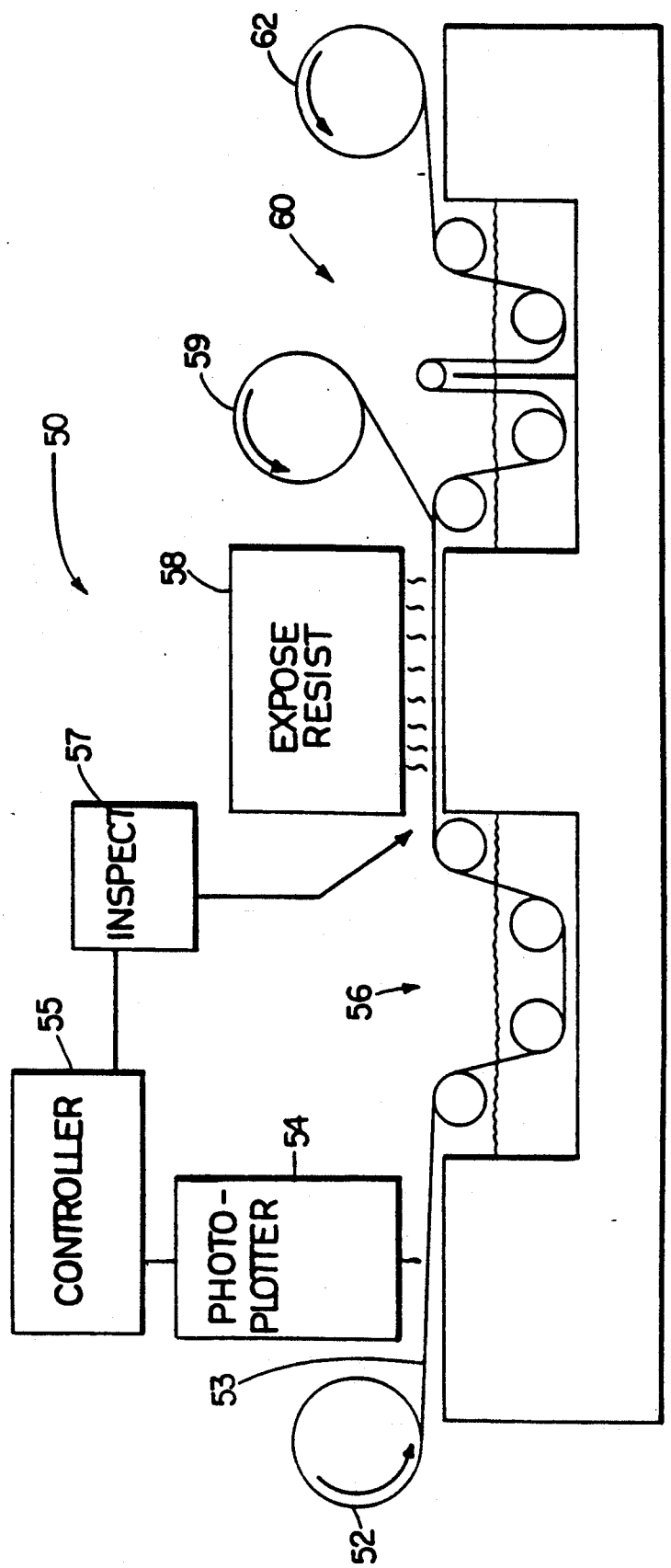
FIG. 3 is a diagrammatic functional representation of a continuous process line for generating TAB tape according to the present invention.
Figure 4A:
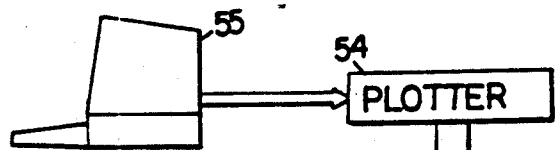
FIGS. 4A–4G are diagrammatic cross-sectional views of a TAB tape undergoing a sequence of steps for providing conductive portions on the tape.
Figure 4B:
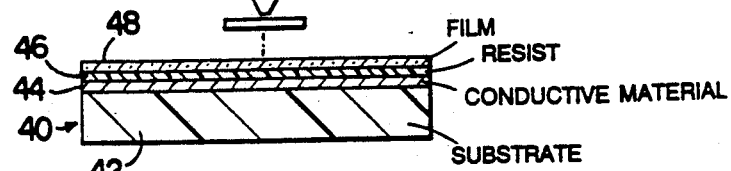

Referring to FIGS. 3 and 4A-4G, system 50 for generating TAB tape 12 includes controller 55 (e.g., a conventional computer) in which the desired chip interconnection patterns 32, 34 for a particular TAB tape are stored. The unexposed tape 40 (FIG. 2a) which is fed from supply reel 52 is moved past photo plotter 54 (e.g., a high resolution, on/off, unidirectional scanner available from General Scanning, Inc., Watertown, Mass.). Controller 55 digitizes and transmits the coordinates of a desired chip interconnection pattern to the control input of the photoplotter 54 which selectively applies directed energy to emulsion layer 48b to provide a highly defined pattern of exposed portions therein (FIG. 4A). Because the tape is moving past photoplotter 54 in one direction at a standard rate, photoplotter 54 need only be movable in another direction which is substantially perpendicular to the direction in which the tape is moving.

After emulsion layer 48b has been exposed, the tape is advanced into monobath film processor 56 in which the film is developed using photographic developing chemistry to provide a highly-defined, high contrast image 49 onto emulsion layer 48b (FIG. 4B) of film 48. The impervious film base 48a protects the underlying resist 46 (FIG. 2A) from exposure to photoprocessing chemicals.

The image may then be inspected, if desired, with image recognition device 57 which detects the image on the TAB tape and passes information about the image to controller 55 which ascertains whether the image corresponds to the desired pattern. This information can be used to determine if photo plotter 54 is operating properly and if film processor 56 is properly developing the film. Because the image is inspected before the tape is completely fabricated, any problems with the process are detected immediately during processing.

Figure 4C:
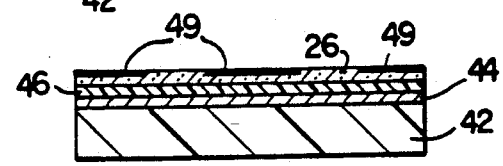

The tape is then moved past resist exposure unit 58 (e.g., a UV flood lamp) in which photoresist layer 46 is uniformly exposed to a directed energy different from that used to expose emulsion layer 48 (FIG. 4C). The darkened areas 49 in the image of film 48 absorb the directed energy and shield portions of the underlying resist. Where film 48 remains transparent, however, the directed energy passes to photoresist layer 46 and polymerizes underlying portions 61. The different directed energy may have a different energy level or a different energy spectrum from that applied to emulsion layer 48b. In exposure unit 58, the duration and the intensity of this directed energy are adjustable. Because emulsion layer 48b, which contains the image of the desired interconnection pattern, is firmly affixed in intimate contact directly over photoresist layer 46, the tape and image are in perfect registration.

Figure 4D:
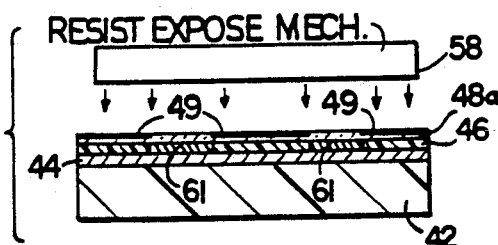
Figure 4E:
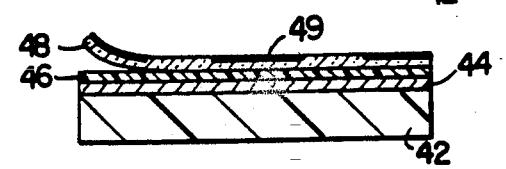
Figure 4F:
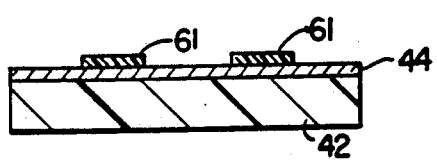
Figure 4G:
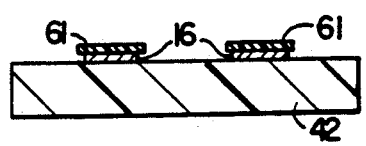

Film 48 is then peeled from the tape onto takeup reel 59 to expose photoresist layer 46 (FIG. 4D). The tape is then advanced through resist developing and copper etching baths 60. Baths 60 have as many segments as necessary to complete the patterning of the resist. The unpolymerized portions of photoresist 46 are removed by chemical action leaving only the polymerized portions 61 over selected areas of conductive layer 44 (FIG. 4E). Conductive layer 44 is etched to form conductors 16 (FIG. 4F) as well as identifying portions 36. Next, polymerized portions 61 are chemically removed leaving conductors 16 as specified by controller 55 (FIG. 4G). If required, the conductors are electroplated to match die metallurgy. After the conductor patterns are formed, the tape is wound onto processed tape take-up reel 62. Because the tape is standard photographic film format (e.g. 35 mm), mechanisms for moving the tape through system 50 are well known and highly refined.

Photoplotter 54, film processor 56, exposure unit 58 and resist developing and etching bath 60 are all adjusted to function at a uniform speed, which is determined by the process which takes the longest to complete. Tape 12 is advanced at a constant speed with plotter 54 continuously generating alternating identifying portions 36 and interconnection patterns 32, 34. Controller 55 enables plotter 54 to form different interconnection patterns to be easily generated on the same strip of tape by sequentially feeding to plotter 54 a series of different patterns stored in controller 55.

Figure 5A:
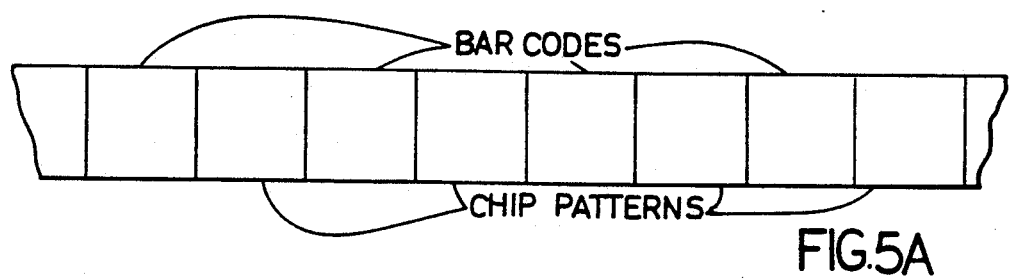
FIGS. 5A and 5B are diagrammatic views of TAB tape having interconnection patterns and identifying portions according to the present invention.
Figure 5B:
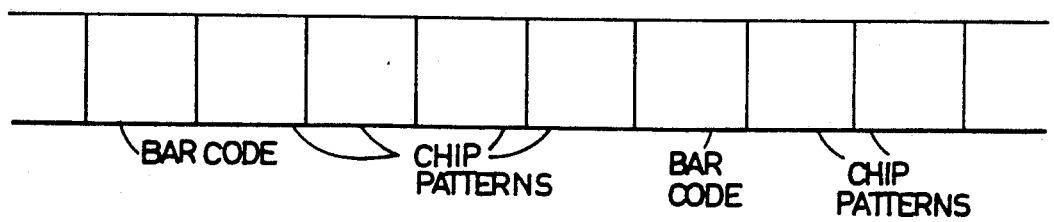

The direct photoplotting TAB system provides enhanced versatility. For example, the interconnection patterns may be placed on the tape in a plurality of different patterns which are sequenced to correspond to a desired mounting sequence. For example, if a PC board requires four different ASICS and a plurality of the boards are being produced, then the interconnection patterns on the tape may be designed to sequentially repeat the four different interconnection patterns presented by the ASICS. In this example, the identifying portion may identify four different patterns which follow in two different ways. Separate codes can be used for each pattern (FIG. 5A) or one code can designate the four pattern sequence (FIG. 5B).

Figure 6:
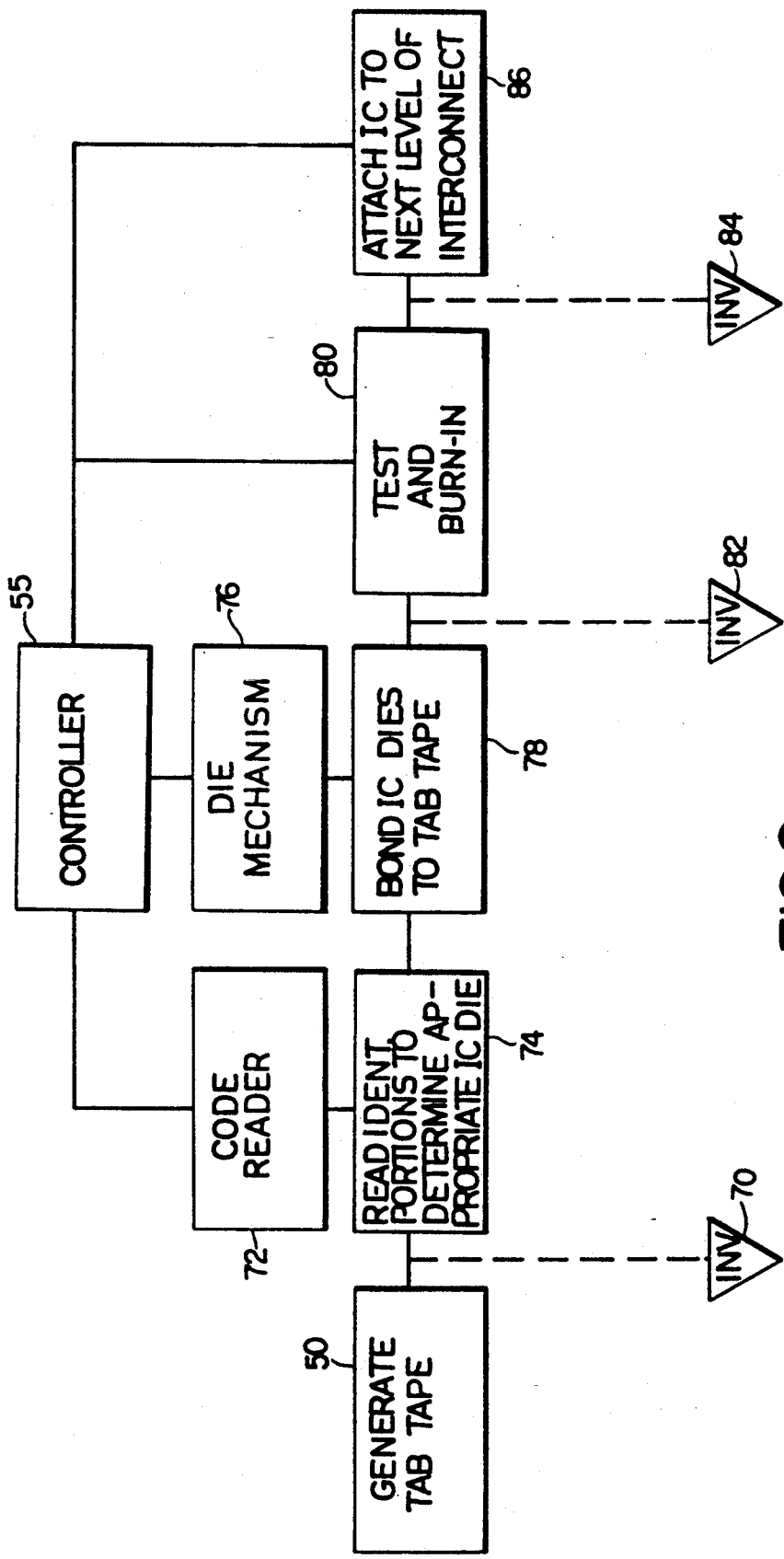
FIG. 6 is a functional block diagram of a system for populating printed circuit boards or the like with ASICs according to the present invention.

Referring to FIG. 6, a TAB bonding system is shown which takes advantage of this versatility. After TAB tape 12 is generated by system 50, TAB tape 12 may be stored on reel 62 and placed in inventory 70 for future interconnection with IC die. Alternately, TAB tape 12 may be immediately used for bonding IC die to the tape.

When bonding TAB tape 12 to IC die, code reader 72 first reads identifying portion 36 of TAB tape 12 to determine information 74 about the IC die. This information may include the type of IC die to be bonded, the count of multiples of a single die type to follow, or a specific sequence of IC die that follow. The frame number may also be included. Information about the serial number and the lot number of both the IC die and the TAB tape may also be included in the information stored in information portion 36. All of this information is passed to controller 55 which uses this information to determine which die to bond to the TAB tape. This information can also be used by controller 55 to provide an overall count of the types of IC die being bonded and to which tape particular IC die are bonded (e.g., for inventory control) and to provide traceability for defective parts (e.g., for quality control).

Controller 55 instructs die mechanism 76 regarding which die to provide to bonding mechanism 78. The IC die may be sequentially loaded in die mechanism 76 to correspond to the different interconnection patterns on TAB tape 12. Alternately, die mechanism 76 may selectively choose the indicated die in real time as informed by the tape via controller 55.

Bonding mechanism 78 then bonds the IC die to the ILB pattern 22a of TAB tape 12. Bonding portions 22 may be simultaneously bonded using a compression bonding thermode or they may be individually bonded using a laser or other directed energy source which is controlled by controller 55.

The TAB tape with IC die attached and isolation cuts 35 open is then passed to test station 80 where test pads 18 are used to test and/or burn-in the IC die. Information regarding the test is provided to controller 55. If the IC die fails, then controller 55 flags this die as a reject and stores this information in its files. If the fabrication has been continuous (i.e., the TAB tape was not inventoried before testing) and an IC fails a test, then controller 55 can instruct TAB generating system 50 to generate another interconnection pattern which corresponds to the failed IC. When this interconnection pattern reaches bonding mechanism 78, controller 55 instructs die mechanism 76 to provide another IC die to bonding mechanism 78. Accordingly, just-in-time fabrication is facilitated because a higher level of assembly is not stopped due to a failure of a lower level of assembly.

If desired, the TAB tape with IC die attached may be inventoried 82, 84 either before or after testing and burning-in 80 the IC die. If the TAB tape is inventoried, then before proceeding to the next stage of system 50, the identifying portions are again used by controller 55 to determine the particular IC die which is present.

After the IC die have been tested, tape bonded ICs may be directly attached to the PC board using bonding mechanism 86 at OLB patterns 22b. The information stored in controller 55 regarding the type of IC die on the TAB tape may be used to instruct bonding mechanism 86 where to position a particular IC die. Thus, because a tape may be generated having a plurality of different TAB patterns, a single tape may be used to provide all the ICs which are necessary to assemble a single printed circuit board requiring a mix of many different standard ICs and ASICs.

Other Embodiments

Other embodiments are within the following claims.

Figure 7:
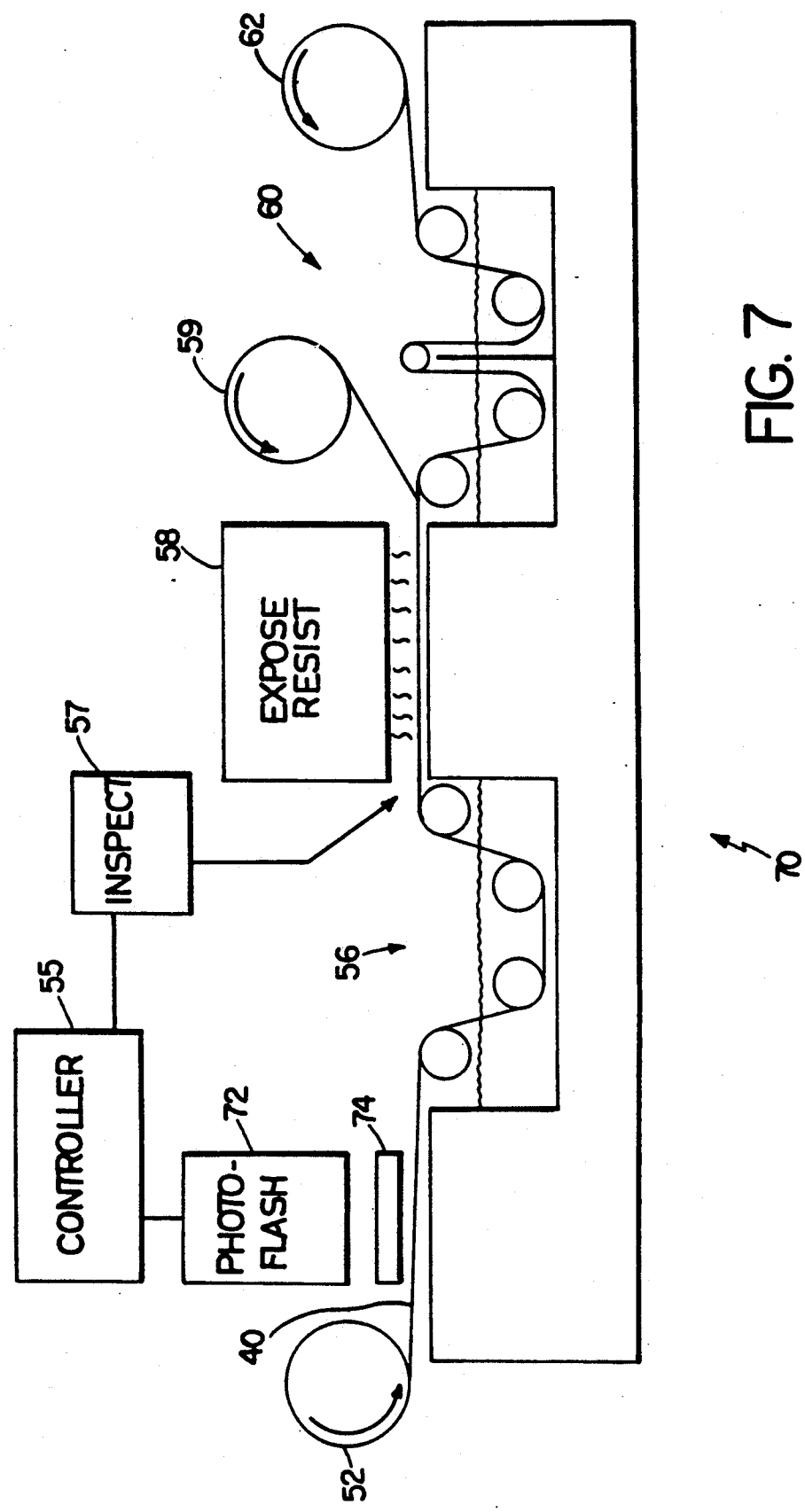
FIG. 7 is a diagrammatic functional representation of a system for high speed replication of interconnection patterns on a TAB tape according to the present invention.

For example, FIG. 7 shows a system for high speed manufacture of duplicate interconnection patterns on a TAB tape; system 70 takes advantage of the high emulsion speed of film 48. High speed system 70 differs from system 50 by using photoflash 72 and photomask 74 in place of photoplotter 54. In operation, photoflash 72 provides a brief burst of directed energy to unexposed tape 40 through photomask 74. Because the energy is brief and relatively low energy compared to that required for resist exposure, there is no need to clamp photomask 74 to tape 40 or to stop tape transport motion during exposure. This results in relatively few problems with registration of the mask. Image recognition device 57 may be used to determine whether flash 72 is providing energy in synchronization with the interconnection portion locations. Because the tape includes a layer of film which has a high emulsion speed, the tape may be transported in a continuous fashion because the photo flash provides a flash which is essentially instantaneous. Thus, when a plurality of chip portions having the same layouts are desired, they may be placed on the tape in an essentially continuous fashion using image-wise exposure of the film instead of photoplotting.

Figure 8:
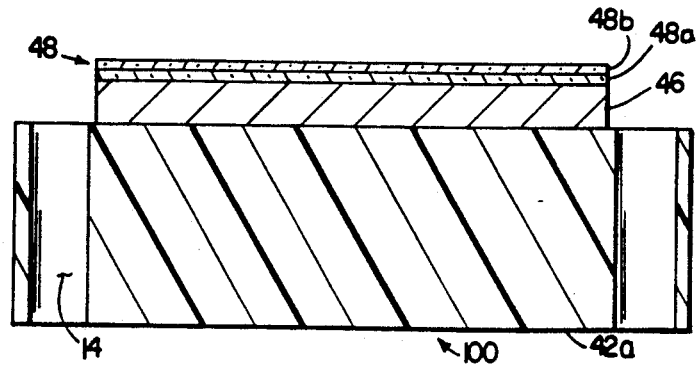
FIG. 8 is a cross-sectional view of a tape for providing windows in a TAB tape substrate according to the present invention.

Also, e.g., referring to FIG. 8, a cross-sectional view of unexposed tape 100 is shown. Tape 100 is used in lieu of prepunched tape to provide windows of various shapes and sizes in substrate 42a. After the windows are provided, the substrate is the same as substrate 42 (FIG. 2A). Unexposed tape 100 includes substrate 42a, e.g., a perforated dielectric film base available from E.I. duPont deNemours Co. under the trade designation Kapton; the perforating provides sprocket holes 14. A photoresist layer 46 is superimposed onto substrate 42a. A thin sheet of strip base photographic film 48, e.g., a high resolution, high contrast, orthochromatic film available from Agfa-Gevaert under the trade designation 08115 or available from 3M under the trade designation TS5, is superimposed over layer 46. Film 48 includes a base layer 48a and an emulsion layer 48b. Substrate 42a is preferably 7 mils thick,, photoresist 46 is preferably 1 mil thick, and film 48 is preferably one-quarter to one-half mil thick.

In manufacture, windows 45 are provided on substrate 42a using the process described with reference to FIG. 3 above with the distinctions that film 48 is illuminated in a pattern corresponding to a desired window pattern and the etching portion of mechanism 60 is a substrate etching portion rather than a copper etching portion. This process advantageously provides a TAB tape which may have a plurality of differently shaped windows.

Other embodiments will occur to those skilled in the art. For example, identifying portions 36 may be any type of code such as a manually readable code or a dot code. Also, e.g., instead of a PC board, the next level of interconnection may be an integrated circuit package, or any other next level interconnection substrate, even a TAB tape.

What is claimed is:

1. A method for producing a TAB tape, comprising:
   providing an elongated flexible multilayer strip of tape having a layer of unexposed, undeveloped photographic film sensitive to first directed energy superimposed over a photoprocessable layer, said photoprocessable layer being superimposed over a conductive layer and said conductive layer being superimposed over a substrate, said layers all being approximately coextensive.
   advancing said unexposed tape strip lengthwise through a photoplotter station having a computer-controlled photoplotter emitting first directed energy,
   selectively exposing consecutive frames of said film layer via said photoplotter in a corresponding plurality of differing integrated circuit interconnection patterns on the same tape strip, advancing the exposed tape strip through a photographic developing bath, developing said film on said tape strip to provide images of said integrated circuit interconnection patterns in said frames, advancing said tape through a uniform exposure unit which provides a substantially uniformly distributed second directed energy, different from said first directed energy, exposing the photoprocessable layer of said tape strip to said second directed energy through the developed image-bearing film layer as an in situ mask, advancing said tape strip lengthwise to a photoprocessable layer processing unit, processing said photoprocessable layer and said conductive layer to provide a plurality of different patterns of conductors on consecutive frames of said tape strip, each frame of said conductors corresponding to a respective one of said integrated circuit interconnection patterns, after processing said photoprocessable and conductive layers, bonding integrated circuits to the individual frames of the tape strip which have interconnection patterns corresponding to the lead bond pattern for the integrated circuits, and selectively exposing a portion of said film to said first directed energy in a plurality of machine readable identifying patterns corresponding to said interconnection patterns, said developing, exposing and processing then providing identifying portions on said tape, along with said interconnection patterns.

2. The method of claim 1 wherein said identifying portion includes a machine readable code.

3. The method of claim 1 wherein there is an identifying portion which corresponds to each different interconnection pattern.

4. The method of claim 3 wherein said identifying portions designate the type of interconnection pattern and the number of each type of interconnection pattern.

5. A method for producing a TAB tape, comprising:

providing an elongated flexible multilayer strip of tape having a layer of unexposed, undeveloped photographic film sensitive to first directed energy superimposed over a photoprocessable layer, said photoprocessable layer being superimposed over a conductive layer and said conductive layer being superimposed over a substrate, said layers all being approximately coextensive.

advancing said unexposed tape strip lengthwise through a photoplotter station having a computer-controlled photoplotter emitting first directed energy, selectively exposing consecutive frames of said film layer via said photoplotter in a corresponding plurality of differing integrated circuit interconnection patterns on the same tape strip, advancing the exposed tape strip through a photographic developing bath, developing said film on said tape strip to provide images of said integrated circuit interconnection patterns in said frames, advancing said tape through a uniform exposure unit which provides a substantially uniformly distributed second directed energy, different from said first directed energy, exposing the photoprocessable layer of said tape strip to said second directed energy through the developed image-bearing film layer as an in situ mask, advancing said tape strip lengthwise to a photoprocessable layer processing unit, processing said photoprocessable layer and said conductive layer to provide a plurality of different patterns of conductors on consecutive frames of said tape strip, each frame of said conductors corresponding to a respective one of said integrated circuit interconnection patterns, after processing said photoprocessable and conductive layers, bonding integrated circuits to the individual frames of the tape strip which have interconnection patterns corresponding to the lead bond pattern for the integrated circuits, and using said identifying portions to determine the type of integrated circuit die to be bonded to a specific interconnection pattern, wherein there is an identifying portion which corresponds to each different interconnection pattern and said tape is exposed to a plurality of different interconnection patterns and a plurality of different identifying patterns.

6. The method of claim 5 further comprising advancing said tape having integrated circuit die bonded to said tape to a mounting mechanism, mounting said integrated circuit die to a next level of interconnection.

7. The method of claim 6 further comprising using said identifying portions to determine the type of integrated circuit present on a particular frame of said tape, and placing the integrated circuit on a particular place on the next level of interconnection based upon the type of integrated circuit.

8. A method for producing a TAB tape, comprising:

providing a strip of photoprocessable TAB tape, advancing said TAB tape strip through an exposure station having a computer-controlled plotter for directing energy to the tape strip in a desired pattern, exposing a connection frame on said TAB tape strip by operating said plotter to create an image of a first IC lead bond connection pattern on said TAB tape strip, advancing said TAB tape strip, exposing another frame of the same said TAB tape strip by operating said plotter to create an image of a second IC lead bond connection pattern, different from said first lead bond connection patter, on said TAB tape strip, processing said TAB tape strip to develop conductive lead bond patterns for said frames corresponding to the images created by said plotter for said frames, bonding a plurality of different IC's to frames on said TAB tape strip having matching conductive lead bond patterns, whereby a TAB tape strip having variable lead bond patterns for different IC's on the same TAB tape is produced with variable frame-by-frame direct plottings, exposing an area of the same said TAB tape strip associated with a given lead bond connection pattern frame by operating said plotter to create an image of a machine readable identifying pattern, said identifying pattern also being developed in said processing step along with said lead bond connection frames, before the step of bonding IC's to the TAB tape, reading a corresponding identifying portion to determine the IC to be bonded to a given frame of the TAB tape, and selecting the IC to be bonded to a particular frame based on the determination made from reading the corresponding identifying portion of the same TAB tape.

9. The method of claim 8, wherein in sequential steps the plotter creates images on the same TAB tape of a plurality of alternating identifying pattern areas and frames of different lead bond connection patterns.

10. The method of claim 8, wherein in sequential steps the plotter creates images on the same TAB tape of a group of frames of different lead bond connection patterns and one identifying pattern to identify the entire group.

* * * * *

UNITED STATES PATENT AND TRADEMARK OFFICE
CERTIFICATE OF CORRECTION

PATENT NO. : 5,260,168

DATED : 11/09/93

INVENTOR(S) : Robert D. Vernon

It is certified that error appears in the above-identified patent and that said Letters Patent is hereby corrected as shown below:

On the title page, item [56]:

Under References Cited - U.S. Patent Documents:
Delete "4,690,374" and insert therefor --4,670,374--.

Under References Cited - Foreign Patent Documents:
Delete "2128351" and insert therefor --2128351A--.

Column 4, line 39, delete "an" and insert therefor --and--.

Signed and Sealed this

Twenty-second Day of November, 1994

Attest:

BRUCE LEHMAN

Attesting Officer

Commissioner of Patents and Trademarks